(12) United States Patent
Corisis et al.

(10) Patent No.: US 6,837,731 B2
(45) Date of Patent: Jan. 4, 2005

(54) LOCKING ASSEMBLY FOR SECURING A SEMICONDUCTOR DEVICE TO A CARRIER SUBSTRATE

(75) Inventors: David J. Corisis, Meridian, ID (US); Jerry M. Brooks, Caldwell, ID (US); Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/458,015

(22) Filed: Jun. 10, 2003

(65) Prior Publication Data

US 2003/0211769 A1 Nov. 13, 2003

Related U.S. Application Data

(60) Continuation of application No. 10/117,294, filed on Apr. 5, 2002, now Pat. No. 6,648,663, which is a continuation of application No. 09/910,318, filed on Jul. 20, 2001, now Pat. No. 6,398,573, which is a continuation of application No. 09/400,126, filed on Sep. 21, 1999, now Pat. No. 6,302,719, which is a division of application No. 09/052,446, filed on Mar. 31, 1998, now Pat. No. 6,071,139.

(51) Int. Cl.[7] .............................................. H01R 13/62
(52) U.S. Cl. ...................................... 439/330; 439/328
(58) Field of Search ................................ 439/330, 327, 439/328, 326, 325, 153; 361/704, 801, 813, 157, 725, 726, 752, 754; 29/729, 758

(56) References Cited

U.S. PATENT DOCUMENTS

| 3,216,580 A | 11/1965 | Fricker |
| 4,095,253 A | 6/1978 | Yoshimura et al. |
| 4,781,612 A | 11/1988 | Thrush |
| 4,946,403 A | 8/1990 | Billman et al. |
| 4,967,262 A | 10/1990 | Farnsworth |
| 4,973,270 A | 11/1990 | Billman et al. |

(List continued on next page.)

OTHER PUBLICATIONS

Rao R. Tummala et al., Microelectronics Packaging Handbook, pps. 760–770, 1989.
Merril L. Minges, "Electronic Materials Handbook Vol. 1 Packaging", pps. 802–824.
Timothy J. Maloney, "Modern Industrial Electronics", Third Edition, pps. 766–767.

*Primary Examiner*—Alex Gilman
(74) *Attorney, Agent, or Firm*—TraskBritt

(57) ABSTRACT

A semiconductor package for vertically surface mounting to a printed circuit board having a retention apparatus for holding the package thereto.

1 Claim, 4 Drawing Sheets

U.S. PATENT DOCUMENTS

| | | | |
|---|---|---|---|
| 4,995,825 A | 2/1991 | Korsunsky et al. |
| 5,026,297 A | 6/1991 | Krehbiel |
| 5,030,115 A | 7/1991 | Regnier et al. |
| 5,041,005 A | 8/1991 | McHugh |
| 5,109,318 A | 4/1992 | Funari et al. |
| 5,209,675 A | 5/1993 | Korsunsky |
| 5,244,403 A | 9/1993 | Smith et al. |
| 5,254,017 A | 10/1993 | Tondreault et al. |
| 5,256,078 A | 10/1993 | Lwee et al. |
| 5,302,133 A | 4/1994 | Tondreault |
| RE34,794 E | 11/1994 | Farnworth |
| 5,366,390 A | 11/1994 | Kinross et al. |
| 5,387,115 A | 2/1995 | Kozel et al. |
| 5,397,857 A | 3/1995 | Farquhar et al. |
| 5,420,751 A | 5/1995 | Burns |
| 5,429,523 A | 7/1995 | Tondreault |
| 5,436,203 A | 7/1995 | Lin |
| 5,463,531 A | 10/1995 | Choon et al. |
| 5,469,332 A | 11/1995 | Alvite |
| 5,475,919 A | 12/1995 | Wu et al. |
| 5,481,434 A | 1/1996 | Banakis et al. |
| 5,490,891 A | 2/1996 | Farquhar et al. |
| 5,557,504 A | 9/1996 | Siegel et al. |
| 5,572,457 A | 11/1996 | Michael |
| 5,790,381 A | 8/1998 | Derouiche et al. |
| 6,071,139 A | 6/2000 | Corisis et al. |
| 6,095,822 A | 8/2000 | Corisis et al. |
| 6,238,228 B1 | 5/2001 | Corisis et al. |
| 6,262,583 B1 | 7/2001 | Martin et al. |
| 6,302,719 B1 | 10/2001 | Corisis et al. |
| 6,320,247 B2 | 11/2001 | Sakamoto |
| 6,330,159 B1 | 12/2001 | Kinsman et al. |
| 6,368,136 B2 | 4/2002 | Corisis et al. |
| 6,398,573 B1 | 6/2002 | Corisis et al. |
| 6,457,985 B1 | 10/2002 | Corisis et al. |
| 6,565,374 B2 | 5/2003 | Corisis et al. |

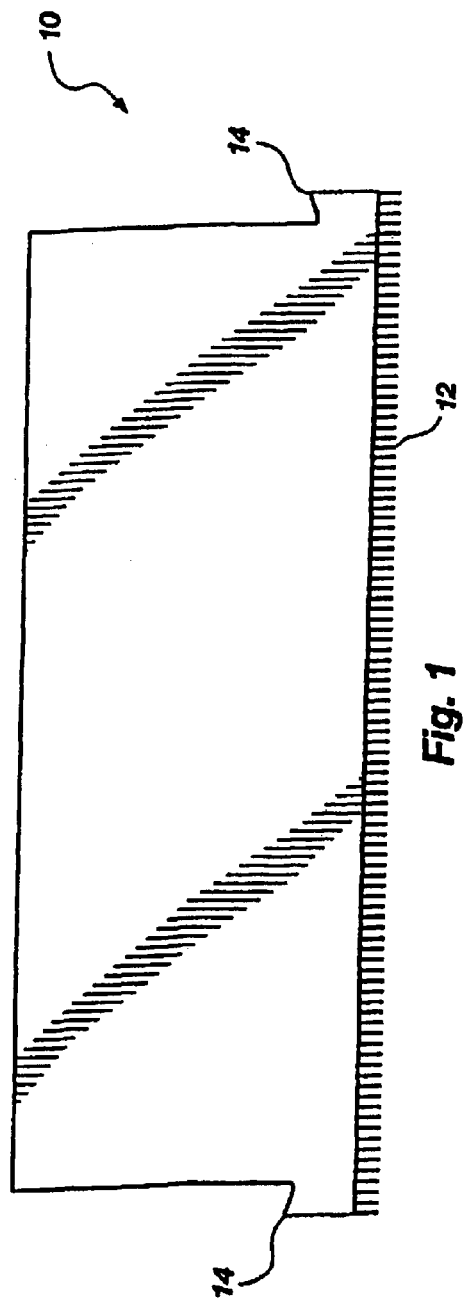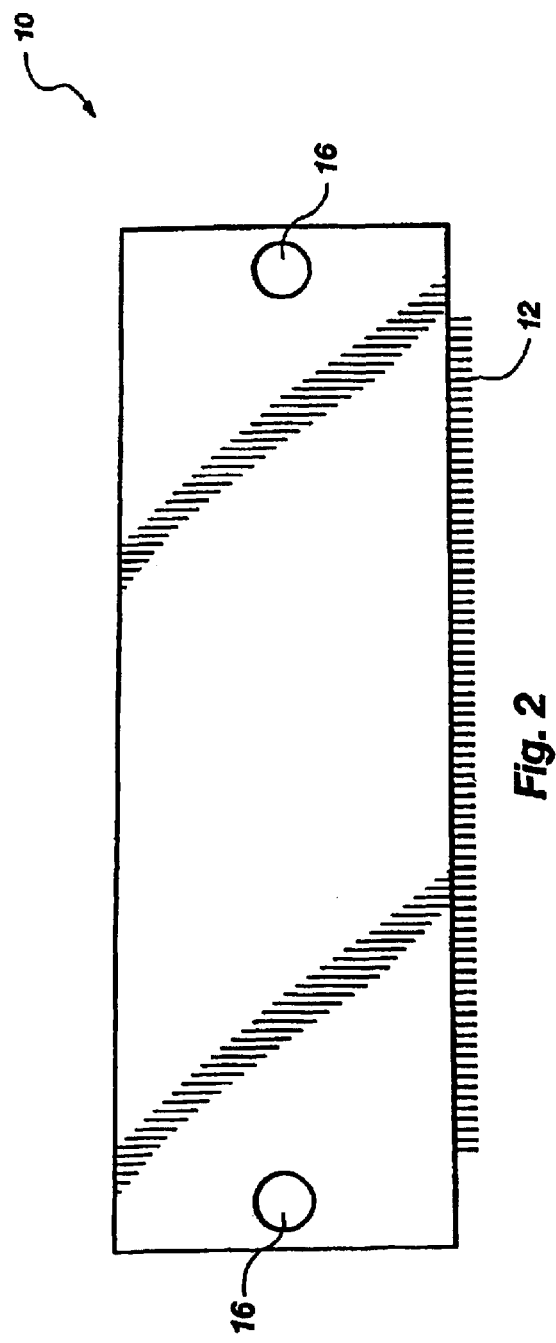

LOCKING ASSEMBLY FOR SECURING A SEMICONDUCTOR DEVICE TO A CARRIER SUBSTRATE

CROSS-REFERENCE TO RELATED APPLICATIONS

This application is a continuation of application Ser. No. 10/117,294, filed Apr. 5, 2002, now U.S. Pat. No. 6,648,663, issued Nov. 18, 2003, which is a continuation of application Ser. No. 09/910,318, filed Jul. 20, 2001, now U.S. Pat. No. 6,398,573, issued Jun. 4, 2002, which is a continuation of application Ser. No. 09/400,126, filed Sep. 21, 1999, now U.S. Pat. No. 6,302,719, issued Oct. 16, 2001, which is a divisional of application Ser. No. 09/052,446, filed Mar. 31, 1998, now U.S. Pat. No. 6,071,139, issued Jun. 6, 2000.

BACKGROUND OF THE INVENTION

1. Field of the Invention

The present invention relates generally to a semiconductor package mounting technique and, more specifically, to high density vertical surface mount packages. More particularly still, the present invention relates to vertical surface mount devices having retention apparatus or devices for holding the package to a surface mount location.

2. State of the Art

Integrated circuit semiconductor devices are fabricated on wafers of silicon to generate semiconductor devices or chips. Each of these chips forms an integrated circuit semiconductor device that must be packaged in order to be utilized within a computer system. One type of package is to encapsulate the semiconductor device in a plastic package, in some instances, with the semiconductor device being bonded to a die paddle of a leadframe. The individual leads of the leadframe are then connected to bond pads on the active surface of the semiconductor device using wires with the units being encapsulated in a suitable plastic or similar material. This plastic encapsulated semiconductor device then undergoes a trim and form operation that separates the interconnected packages on leadframe strips into individual entities and then bends the exposed leads of the remaining leadframe extending from the package. This is the traditional and most recognized form of semiconductor device package and utilizes a highly automated manufacturing technology.

Several types of semiconductor device packages that have found favor include a package having dual in-line metal lead packages or DIP, which typically were through hole soldered onto a printed circuit board, and a pin grid array (PGA) package that includes a plurality of under-leads that are usually either through hole soldered to a substrate or inserted in a receiving unit. Additional types of semiconductor device packages include the ball grid array, which is soldered onto the surface of the printed circuit board. Additionally, a new type of dual in-line lead design has been provided and is known as the small outline J-Lead package (or "SOJ" package). The SOJ package has advantages over the standard DIP design for the following reasons. First, the leads of a SOJ package are soldered to only one side of the circuit board, thus leaving the other side of the board free for the mounting of additional SOJ packages. Second, the leads are much less vulnerable to damage prior to board assembly; hence, there are fewer rejections. The SOJ package has extended to include a zig-zag in-line package or ZIP and provides advantages of allowing the package to be mounted vertically. Vertical packages have a narrower horizontal cross section than the horizontally attached DIP or SOJ or PGA packages. Vertical packages allow the distance between other vertical packages to be quite minimal to the horizontal packages.

In ZIP packages or in vertical packages, all leads exit through the lower edge of the package. Since the vertical packages with a single edge being attached to the printed circuit board must be held in place before a solder reflow operation is performed, they have a limited appeal because of the difficulty in maintaining the vertical packages in such vertical position.

Solutions have been provided to allow for the positioning of ZIP vertical packaging without the need for additional package support structures until the final attachment of the package to the circuit board during a solder reflow operation. One such example is described in U.S. Pat. No. Reissue 34,794 ("the '794 reissue patent"), reissued Nov. 22, 1994. The '794 reissue patent describes a semiconductor package having a gull-wing zig-zag, in-line lead configuration and package anchoring devices. The anchoring devices allow the semiconductor package to be rigidly fixed to a circuit board such that each lead resiliently contacts its associated mounting pad on the board. The particular anchoring device includes anchoring pins having fish-hook type bars that lock against the other side of the board when the pegs are inserted through the holes. Further, the anchoring pins can be adhesively bonded in recesses as provided in a circuit board. This type of arrangement has several disadvantages. The first disadvantage is that the printed circuit board or circuit board must include holes for receiving the anchoring devices. These holes may crack and cause the circuit board to split along such a fracture, thus ruining the board. Additionally, since the anchoring devices are inflexible, they too may fracture and break and thus release the semiconductor package that is in a bias tension against the circuit board because of the anchoring devices. Furthermore, the anchoring devices must extend out from either side of the semiconductor devices, which anchoring devices may require additional spacing, thus limiting the number of packages that can be vertically mounted on the circuit board.

Accordingly, an improved type of vertical package of the ZIP where the anchoring apparatus overcomes the problems inherent in the prior solution of the anchoring devices inserted into the circuit board is needed.

BRIEF SUMMARY OF THE INVENTION

The present invention relates to semiconductor package mounting techniques for high density vertical surface mount packages having retention apparatus for holding the package to a surface mount location.

BRIEF DESCRIPTION OF THE SEVERAL VIEWS OF THE DRAWINGS

FIG. 1 is a front plan view of a first embodiment of a gull-wing vertical surface mount package according to the present invention;

FIG. 2 is a front plan view of a second embodiment of a gull-wing ZIP vertical surface mount package according to the present invention;

DETAILED DESCRIPTION OF THE INVENTION

Drawing FIG. 1 depicts a first embodiment of a vertical surface mount package (VSMP) having a locking device for holding the VSMP in place on a circuit board by pressure. Package 10, having a suitable integrated circuit device or semiconductor device therein which may include memory for a computer, includes a plurality of gull-wing, zig-zag, in-line package leads 12, mounted to a bottom surface edge of package 10. A pair of locking shoulders 14 of the package 10 each receive a locking pin that attaches to a circuit board or substrate. Drawing FIG. 2 depicts an alternative embodiment of package 10 still having the plurality of gull-wing, zig-zag, in-line package leads 12. Instead of having locking shoulders 14, locking openings 16 are provided into which J-shaped locking pins insert and hold package 10 in bias tension against a circuit board. In either embodiment, the gull-wing, zig-zag, in-line package leads 12 can extend the full length of the bottom of the package 10 to the very edge of package 10. This allows a greater density of contacts to be provided than would otherwise be possible in the prior art systems of the anchoring pins as taught in U.S. Pat. No. Reissue 34,794, entitled Gull-Wing, Zig-Zag, Inline-lead Package Having End-of-Package Anchoring Pins, incorporated herein by reference for all purposes.

Figure 3:
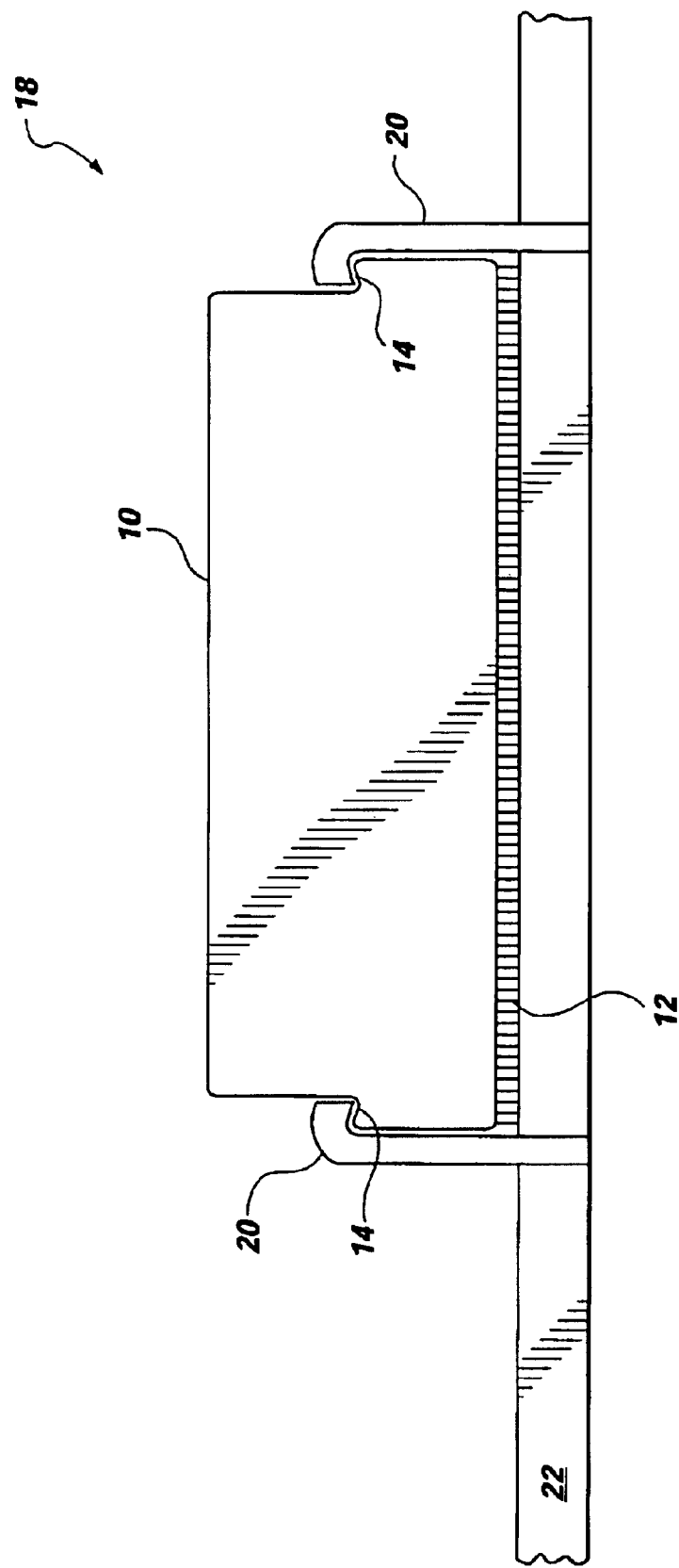
FIG. 3 is a cross-sectional front plan view of the gull-wing ZIP package of FIG. 1 as mounted to a circuit board.

Drawing FIG. 3 depicts in cross-sectional view a package connection assembly 18 where package 10 is mounted to a printed circuit board 22, or any other suitable substrate, using J-hooks (also called J-shaped locking pins) 20. The package 10 includes one or more integrated circuit devices or semiconductor devices (shown in dotted outline) therein which may include memory type semiconductor devices or combination processor and memory type devices. The J-hooks 20 latch onto locking shoulders 14 of package 10. Printed circuit board 22 can be any type of printed circuit board including a personal computer motherboard or a daughter card, or any other carrier card mounted to a motherboard.

J-shaped locking pins 20 are mounted to printed circuit board 22 either by being soldered in place or resiliently press fitted into printed circuit board 22. J-shaped locking pins 20 are also designed to resiliently flex when inserting and locking in place semiconductor device package 10 or when removing package 10. The gull-wing package leads 12 are resiliently biased against matching bonding pads on printed circuit board 22 when the package 10 is secured in place with J-shaped locking pins 20 resiliently engaging locking shoulders 14.

Package 10, as shown in drawing FIG. 3, allows the gull-wing package leads 12 to extend the full length of the bottom of package 10. This allows for a greater density of leads to be biased in connection to printed circuit board 22. Further, since J-shaped locking pins 20 mount into printed circuit board 22, rather than package 10 having anchoring pins inserted into openings in printed circuit board 22, the tension or force acting on printed circuit board 22 is greatly reduced because either a much stronger mechanical connection is provided via the soldering of J-shaped locking pins 20 into printed circuit board 22 or J-shaped locking pins 20 are resiliently biased much more readily than any anchoring pins that would have been attached to package 10 as previously described in the prior art section. With the pins readily replaceable, should one break, the package 10 itself is not damaged but an inexpensive and easily replaceable anchoring device is thereby provided.

Figure 4:
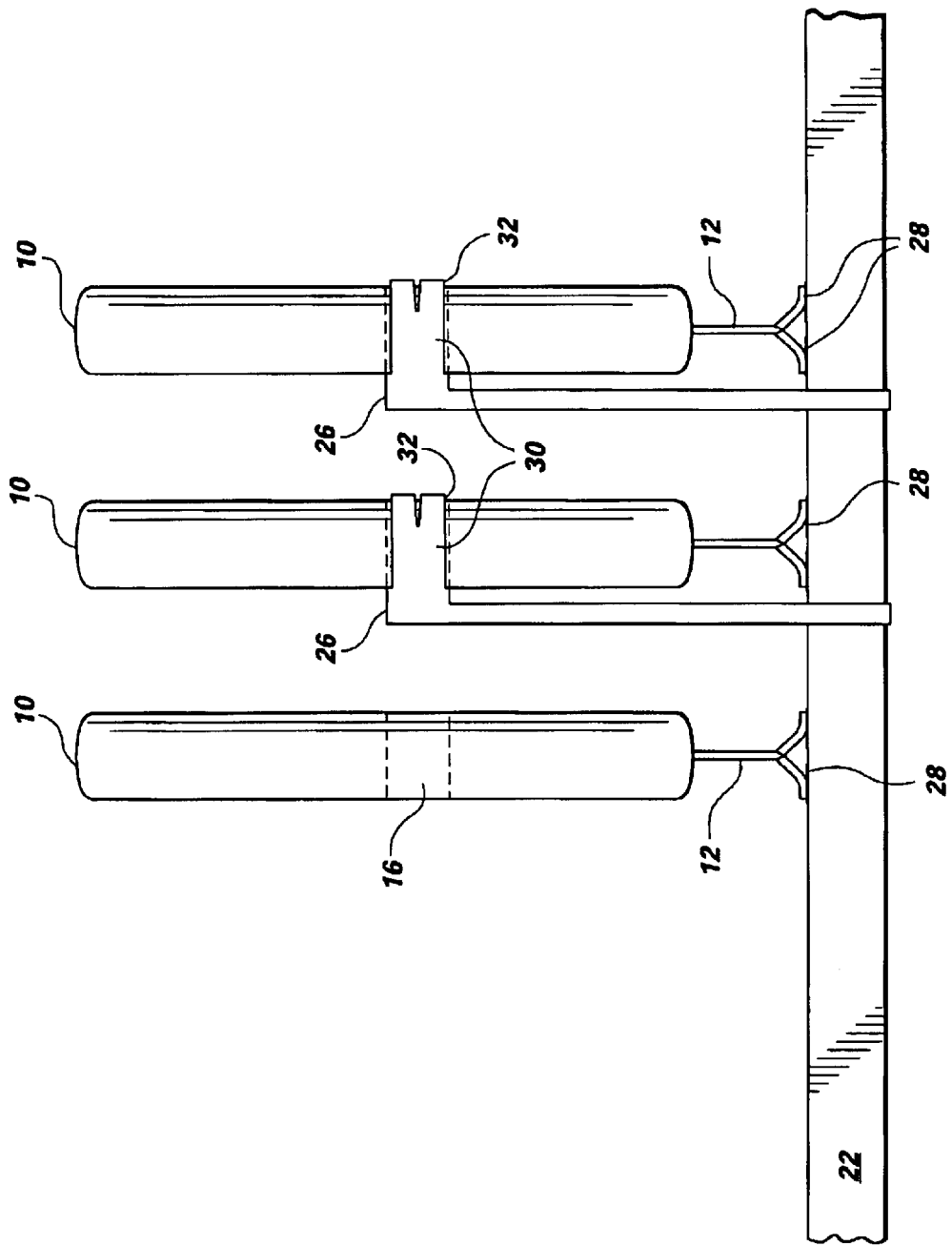
FIG. 4 is a cross-sectional side view of the gull-wing ZIP package of FIG. 2 in a plurality mounted configuration.

Drawing FIG. 4 illustrates a cross-sectional side view of a plurality of packages 10 mounted to printed circuit board 22. In the embodiment of drawing FIG. 4, the manner of locking is the same as that depicted in drawing FIG. 2. In this instance, a locking pin 26 is fitted within printed circuit board 22 having a resilient biasing portion 30, which fits and is received within locking opening 16, and is retained in a biased position within locking opening 16 by N-hooks 32. For removing J-shaped locking pin 26 from locking opening 16, the end of the N-hook 32 of resilient biasing portion 30 is urged together sufficiently so that it may be removed through locking opening 16. Once in position, the gull-wing package leads 12 are resiliently biased against lead contacting board traces 28.

J-shaped locking pins 26 can be soldered in printed circuit board 22 or resiliently press fitted in printed circuit board 22. Further, J-shaped locking pins 26 are able to resiliently flex when loading or removing package 10.

Integrated circuit package 10 can be any type of circuit device contemplated for use within a computer system. For example, package 10 can be used to clear the memory devices of a computer system or be used to implement a memory storage device of a computer system. Other types of implementation may incorporate a processing unit that either provides the main functions of operation within a computer system or any preferable implantation processing capabilities such as for a video card or any other preferable device. An example of the manner in which the semiconductor device package 10 may be integrated into a computer system is illustrated in drawing FIG. 5.

Figure 5:
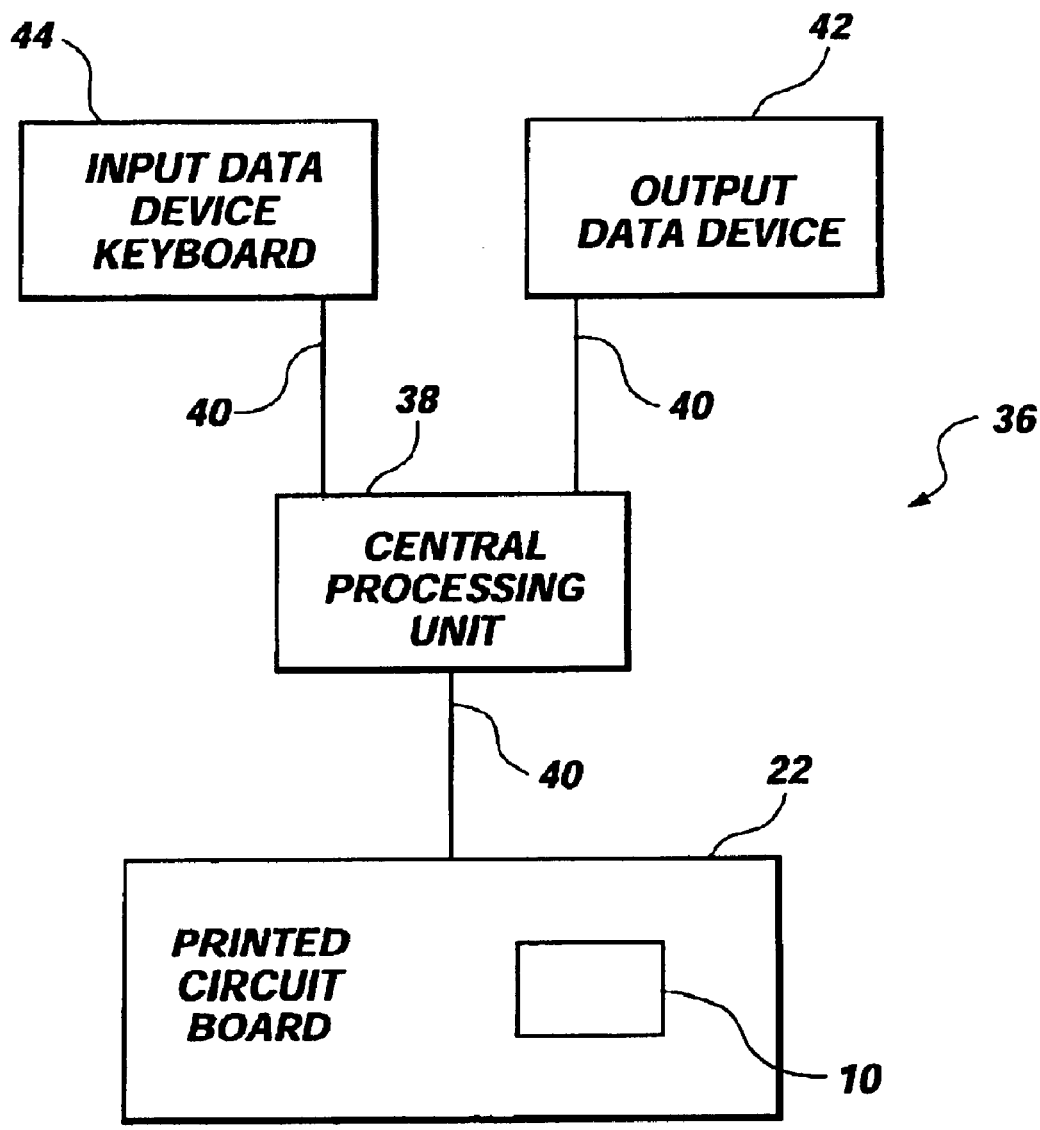
FIG. 5 is a schematic diagram of the present invention connected to a computer.

Referring to drawing FIG. 5, illustrated in block diagram form is a computer system 36 integrated with the semiconductor device package 10 mounted to a printed circuit board 22. Printed circuit board 22 further includes a central processing unit 38, connected to a bus 40, which further communicates through output data device 42 and input data device keyboard 44. Additional preferable structures for a computer system 36 would be readily apparent to those skilled in the art.

Additional embodiments are possible with the concepts outlined in either drawing FIG. 1 or drawing FIG. 2 as well as in drawing FIGS. 3 and 4. One example would be to mount semiconductor device packages 10 on either side of the printed circuit board 22 in such a fashion to double the amount of surface mount vertical packages connected to the printed circuit board 22.

Other embodiments will become readily apparent to those skilled in the art. As such, any such changes or modifications that are apparent to those skilled in the art may be made thereto without departing from the spirit and the scope of the invention as claimed.

What is claimed is:

1. A high density vertical surface mount package having a semiconductor die for use in a computer comprising:

a substrate having a plurality of circuits located on at least one surface thereof and having at least two apertures therethrough for use in a computer;

two J-shaped locking pins for attaching and removing at least one packaged semiconductor die to the substrate, each J-shaped locking pin of the two J-shaped locking pins including a stem portion and a hooking portion, the hooking portion having a curved portion formed on a first end of the stem portion and having a thickness, each J-shaped locking pin of the two J-shaped locking pins attached to the substrate using an aperture therein for engaging the substrate, the curved portion of the hooking portion of each of the two J-shaped locking pins facing each other and aligned having the curved portion of the hooking portion of one J-shaped locking pin of the two J-shaped locking pins facing the other J-shaped locking pin of the two J-shaped locking pins; and the at least one packaged semiconductor die for use in the computer, the at least one packaged semiconductor die having a first edge for vertically supporting the at least one packaged semiconductor die on the substrate, and having at least one J-shaped locking edge located on each side adjacent the first edge of the at least one packaged semiconductor die for receiving the curved portion of the hooking portion of each J-shaped locking pin of the two J-shaped locking pins attached to the substrate, the at least one packaged semiconductor die having a thickness no wider than the thickness of the hooking portion of each J-shaped locking pin of the two J-shaped locking pins for connecting the at least one packaged semiconductor die to the substrate while allowing removal therefrom and having a plurality of in-line package leads extending along a length of the first edge of the at least one packaged semiconductor die, each lead of the plurality of leads extending downwardly from the at least one packaged semiconductor die, a portion of each of the plurality of leads extending below the at least one packaged semiconductor die and resiliently biasing a portion of each of the plurality of leads against at least one circuit of the plurality of circuits located on the at least one surface of the substrate.

* * * * *